(12) United States Patent
Torres et al.

(10) Patent No.: US 10,153,631 B2
(45) Date of Patent: Dec. 11, 2018

(54) ELECTRICAL PROTECTION DEVICE AND METHOD OF PROTECTING AN ELECTRONIC DEVICE

(71) Applicant: STMicroelectronics S.R.L., Agrate Brianza (IT)

(72) Inventors: Antonino Torres, Catania (IT); Davide Giuseppe Patti, Mascalucia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 393 days.

(21) Appl. No.: 14/957,430

(22) Filed: Dec. 2, 2015

(65) Prior Publication Data
US 2016/0268796 A1 Sep. 15, 2016

(30) Foreign Application Priority Data

Mar. 11, 2015 (IT) .................. 102015000008245

(51) Int. Cl.
*H02H 3/08* (2006.01)
*H02H 9/02* (2006.01)

(52) U.S. Cl.
CPC ............ *H02H 3/08* (2013.01); *H02H 9/025* (2013.01); *H03K 2217/0018* (2013.01)

(58) Field of Classification Search
CPC ... H02H 3/08; H02H 9/025; H03K 2217/0018
See application file for complete search history.

(56) References Cited

U.S. PATENT DOCUMENTS

| | | | | |
|---|---|---|---|---|
| 5,581,170 A | * | 12/1996 | Mammano | H02J 7/0019 320/116 |
| 5,622,789 A | * | 4/1997 | Young | G01R 31/3648 320/152 |
| 6,486,727 B1 | | 11/2002 | Kwong | |
| 6,816,349 B1 | | 11/2004 | Chaney et al. | |
| 2002/0185681 A1 | * | 12/2002 | Nakano | H01L 29/0696 257/336 |
| 2012/0307122 A1 | * | 12/2012 | Liu | G05F 1/56 348/332 |
| 2014/0015046 A1 | | 1/2014 | Thiele et al. | |
| 2015/0014687 A1 | | 1/2015 | Nakajima | |

FOREIGN PATENT DOCUMENTS

| | | |
|---|---|---|
| CN | 1497725 A | 5/2004 |
| JP | 2003-198350 A | 7/2003 |

* cited by examiner

*Primary Examiner* — Zeev V Kitov
(74) *Attorney, Agent, or Firm* — Seed IP Law Group LLP

(57) ABSTRACT

An electrical protection device including an input line, an output terminal, and a power transistor coupled between the input line and the output terminal A sensing transistor is connected between the input line and the output terminal and has a body terminal. A control stage is coupled to respective control terminals of the power transistor and of the sensing transistor and is configured to limit a first current of the power transistor to a protection value. A body-driving stage is coupled to the body terminal and is configured to bias the body terminal of the sensing transistor as a function of an operating condition of the power transistor.

19 Claims, 3 Drawing Sheets

ELECTRICAL PROTECTION DEVICE AND METHOD OF PROTECTING AN ELECTRONIC DEVICE

BACKGROUND

Technical Field

The present disclosure relates to an electrical protection device and to a method of protecting an electronic device.

Description of the Related Art

As is known, frequently used in electronic apparatuses are protection devices that basically have the purpose of preventing current overloads and any damage that might derive therefrom.

Conventional fuses are very commonly used, which perform in an excellent way the function of protection; however, they are irreversible. Evidently, full functionality of the protected devices cannot be restored until the blown fuses are replaced.

To get over this problem, use of so-called electronic fuses (e-fuses) is often preferred. Devices of this type exploit power MOSFETs configured to limit the maximum current that may be transferred to a load to be protected. Normally, however, onset of an overcurrent leads to saturation of the power MOSFET and modifies the working point of the electronic fuse in a substantial and permanent way, at least until a reset operation is carried out. As shown in FIG. 1, in practice, as long as the power MOSFET remains in the ohmic region, as the current required by the load (designated by I') increases the electronic fuse is able to supply a current $I_0$ that is limited to a protection value $I_{TRIP}$. An overcurrent may send the power MOSFET into saturation. The maximum current is effectively limited to the protection value $I_{TRIP}$, but then the power MOSFET remains in saturation and a maximum saturation current $I_{SAT}$ that can be provided by the electronic fuse is lower than the protection value $I_{TRIP}$. To restore the initial working conditions, also in this case a reset operation is necessary. It is evident that, if the normal working conditions of the protected device include a current between the maximum saturation current $I_{SAT}$ and the protection value $I_{TRIP}$, after tripping of the electronic fuse the protected device cannot be supplied properly until reset is carried out.

BRIEF SUMMARY

An aim of the present disclosure is to provide an electrical protection device and a method of protecting an electronic device that enable the limitations described to be overcome.

According to one embodiment of the present disclosure an electrical protection device an electrical protection device includes an input line, an output terminal, and a power transistor coupled between the input line and the output terminal. A sensing transistor is coupled between the input line and the output terminal and has a body terminal. A control stage is coupled to respective control terminals of the power transistor and of the sensing transistor and configured to limit a first current of the power transistor to a protection value. A body-driving stage is coupled to the body terminal and configured to bias the body terminal of the sensing transistor as a function of an operating condition of the power transistor.

BRIEF DESCRIPTION OF THE SEVERAL VIEWS OF THE DRAWINGS

For a better understanding of the disclosure, an embodiment thereof will now be described, purely by way of non-limiting example and with reference to the attached drawings, wherein.

DETAILED DESCRIPTION

Figure 2:
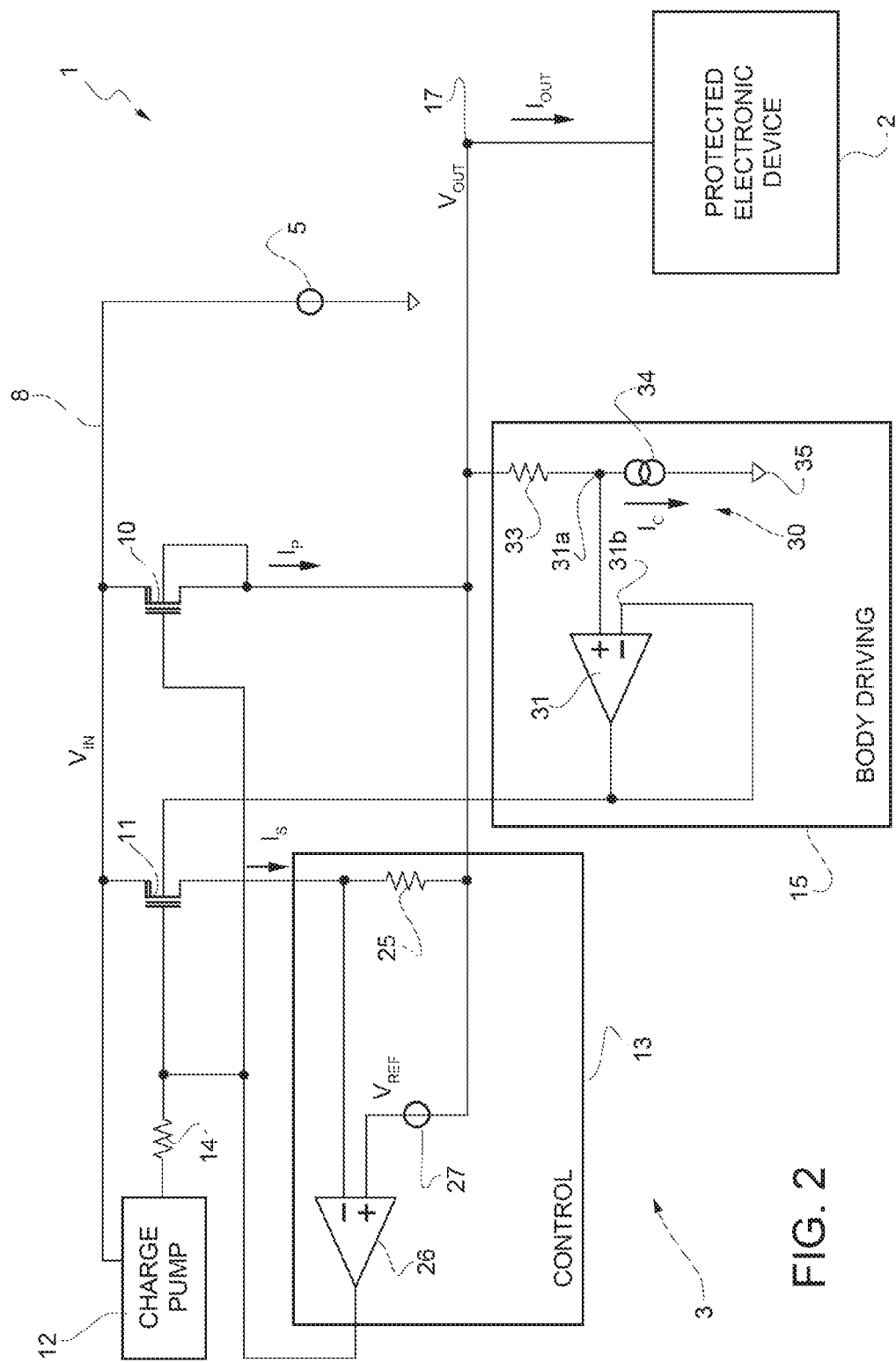
FIG. 2 is a hybrid block diagram and electrical diagram of an electronic apparatus including a protection device according to one embodiment of the present disclosure.

With reference to FIG. 2, an electronic apparatus 1 includes a protected electronic device 2 and a protection device 3 according to one embodiment of the present disclosure.

The protected electronic device 2 may be any type of electronic device that requires protection from overcurrent. By way of non-limiting example, the protected electronic device 2 may be a hard disk or a USB power-supply unit.

The protection device 3 receives an input voltage $V_{IN}$ from a source 5, which may be either internal (for example, a battery) or external to the electronic apparatus 1 (for example, a mains power line), and supplies an output current $I_{OUT}$ to the protected electronic device 2.

The protection device 3 includes an input line 8, a power transistor 10, a sensing transistor 11, a charge pump 12, a control stage 13, a body-driving stage 15, and an output terminal 17.

The input line 8 is connected to the source 5 for receiving the input voltage $V_{IN}$.

Figure 1:
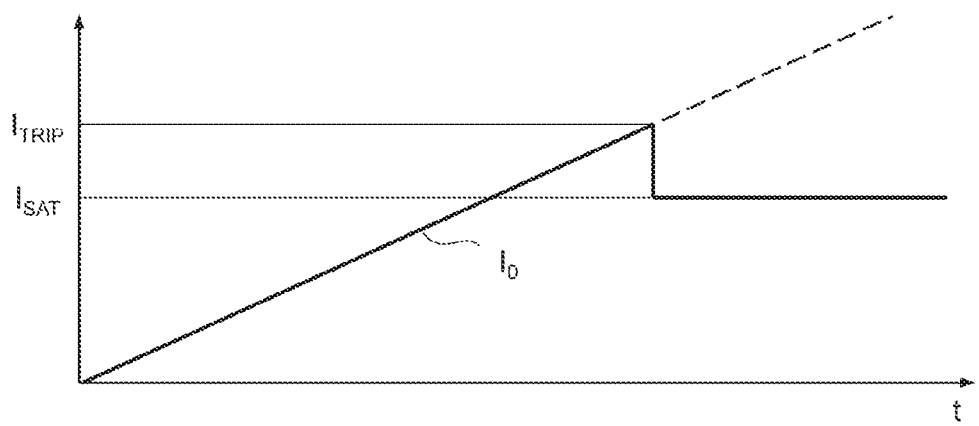
FIG. 1 is a graph representing electrical quantities regarding a known protection device.
Figure 3:
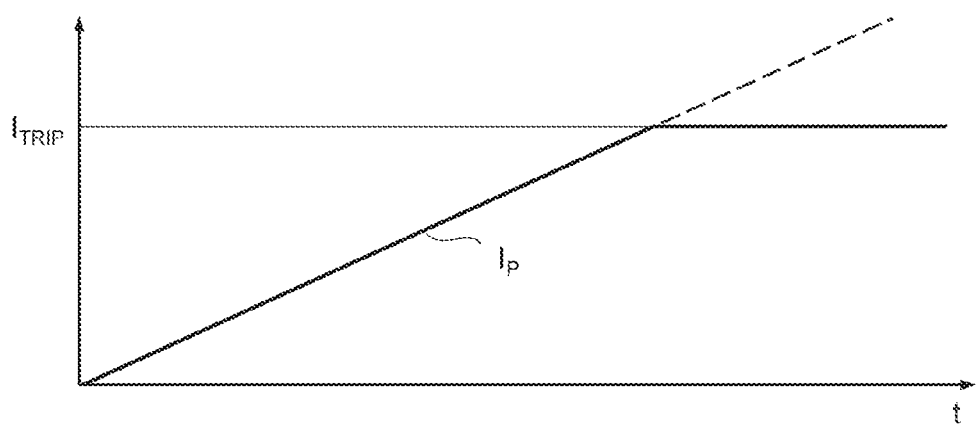
FIG. 3 is a graph representing electrical quantities regarding the protection device of FIG. 2.

In one embodiment, the power transistor 10 is an N-channel MOS transistor and has its drain terminal coupled to the input line 8 and its source terminal coupled to the output terminal 17. In the example described, the drain-to-source voltage of the power transistor 10 is given by the difference between the input voltage $V_{IN}$ and the output voltage $V_{OUT}$ on the output terminal 17. The gate terminal of the power transistor 10 is coupled to output of the charge pump 12, through a resistor 14, and to an output of the control stage 13. Further, the power transistor 10 has its source terminal short-circuited with its respective body terminal. A power current $I_P$ flows through the power transistor 10 and is limited to a protection value $I_{TRIP}$ (see also the graph of FIG. 3, which shows the power current $I_P$, represented with a solid line, as the current required by the protected electronic device 2, represented with a dashed line, increases).

Figure 4:
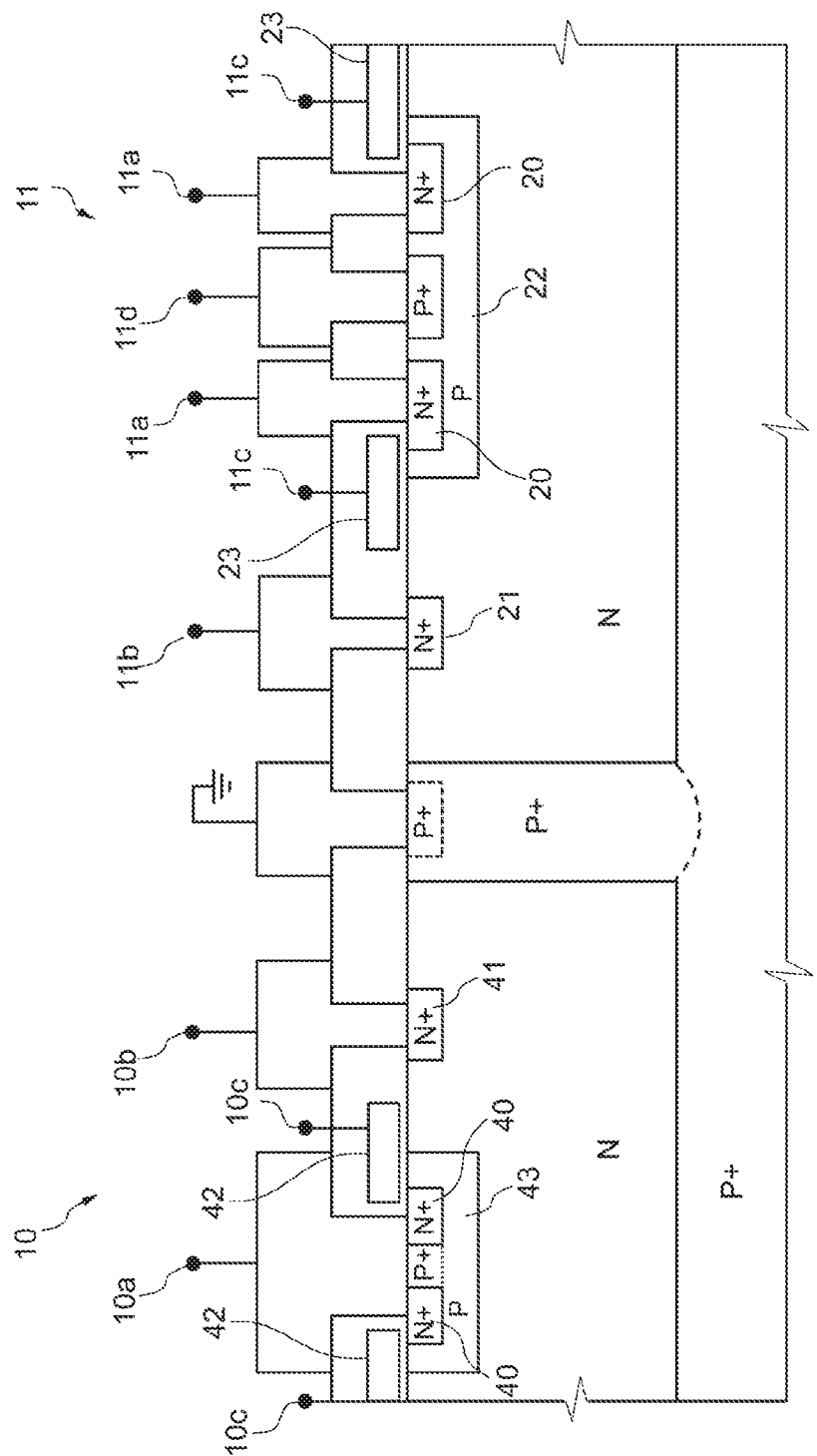
FIG. 4 is a cross-section through a component of the protection device of FIG. 2.

In one embodiment, the sensing transistor 11 is a low-voltage N-channel MOS transistor and has an aspect ratio smaller by a factor K than the aspect ratio of the power transistor 10. Further, the sensing transistor 11 is a transistor with four available terminals. As shown in FIG. 4, in particular, the sensing transistor 11 has source regions 20 and a drain region 21, all with a first conductivity type (here N+), in a body region 22, having a second conductivity type (here P). A gate region 23 is arranged on the body region 22 between the source region 20 and the drain region 21. Normally, in MOS transistors the source region and the body region are short-circuited, as in the case of the power transistor 10 (see once again FIG. 4, which shows source regions 40, a drain region 41, gate regions 42, and a body region 43 of the power transistor 10, and source, drain, and gate terminals designated by 10a, 10b and 10c, respectively). In the sensing transistor 11, instead, in addition to the source, drain, and gate terminals (designated by 11a, 11b, and 11c, respectively) a distinct body terminal 11d is available for biasing the body region 22 independently of the source region 20 and the gate region 21.

With reference once again to FIG. 2, the sensing transistor 11 has its drain terminal 11b coupled to the input line 8 and its source terminal 11a coupled to the output terminal 17 through a resistive sensing element 25, which forms part of the control stage 13. The gate terminal 11c of the sensing transistor 11 is coupled to the outputs of the charge pump 12 and of the control stage 13. The body terminal 11d is instead coupled to an output of the body-driving stage 15. A sensing current $I_S$ flows through the sensing transistor 11.

The charge pump 12 is coupled to the input line 8 and may be actuated to drive the power transistor 10 and the sensing transistor 11 as a function of the state of the control stage 13.

The control stage 13 includes the resistive sensing element 25, as already mentioned, and, further, a control amplifier 26 and a reference-voltage generator 27, which supplies a reference voltage $V_{REF}$. The resistive sensing element 25 and the reference-voltage generator 27 have a terminal in common, in particular connected to the output terminal 17, and each have a further terminal connected to a respective input of the control amplifier 26. The output of the control amplifier 26 is connected to the gate terminal of the power transistor 10 and to the gate terminal 11a of the sensing transistor 11, as well as to the output of the charge pump 12 through the resistor 14. The control amplifier 26 is configured to drive the gate terminals of the power transistor 10 and of the sensing transistor 11 as a function of the voltage on the resistive sensing element 25.

The body-driving stage 15 is configured to bias the body terminal 11d (FIG. 4) of the sensing transistor 11 as a function of the drain-to-source voltage of the power terminal, so as to prevent the current through the power transistor 10 from being overlimited when the power transistor 10 itself goes into saturation. In one embodiment, in particular, the body-driving stage 15 is configured to bias the body terminal 11d of the sensing transistor 11 so that a ratio between the power current $I_P$ of the power transistor 10 and the sensing current $I_S$ of the sensing transistor 11 is substantially constant.

In one embodiment, the body-driving stage 15 includes a sensing network 30 and a body-driving amplifier 31 in follower configuration. The sensing network 30 may include a resistor 33 and a current generator 34 connected in series between the output terminal 17 and a line 35 at constant potential, for example ground potential. In particular, the resistor 33 is connected to the output terminal, whereas the current generator 34 is connected to the constant-potential line 35.

The body-driving amplifier 31 has a first input 31a, in particular an non-inverting input, connected to an intermediate node between the resistor 33 and the current generator 34 and a second input 31b, in particular an inverting input, connected directly to the output, for obtaining the follower configuration.

The output of the body-driving amplifier 31 is further coupled to the body terminal 11d of the sensing transistor 11 and enables application of a body voltage $V_B$ to the body region 22.

The current generator 34 supplies a constant current $I_C$, and thus on the first input 31a of the body-driving amplifier 31 there is a driving voltage $V_D$ equal to $(V_{OUT}-R_0 I_C)$, where $R_0$ is the resistance of the resistor 33. Given the dependence upon the output voltage $V_{OUT}$, the voltage on the first input 31a of the body-driving amplifier 31 indicates the drain-to-source voltage of the power transistor 10 and thus the state of the latter (operation in the ohmic region or in saturation). Further, since the body-driving amplifier 31 is in follower configuration and operates as a buffer, the body voltage $V_B$ is equal to the driving voltage $V_D$.

Initially, the power transistor 10 and the sensing transistor 11 are biased to operate in the ohmic region with conditions of output current $I_{OUT}$ within a nominal range of values. In these conditions, the sensing current $I_S$ through the sensing transistor 11 is proportional to the power current $I_P$ through the power transistor 10 according to the factor K.

As long as the voltage determined by the sensing current $I_S$ on the resistive sensing element 25 is lower than the reference voltage $V_{REF}$ (FIG. 3), the control amplifier 26 (FIG. 2) is completely unbalanced and, co-operating with the charge pump 12, forces the power transistor 10 and the sensing transistor 11 to operate in the ohmic region. If the output current $I_{OUT}$ required by the protected electronic device 2 increases (by way of example according to a ramp as in FIG. 3), the control amplifier 26 regulates the voltage on the gate terminals of the power transistor 10 and of the sensing transistor 11 so that the voltage on the resistive sensing element 25 will not exceed the reference voltage $V_{REF}$. When the power current $I_P$ reaches a protection value $I_{TRIP}$, in particular, we have $$V_{REF}=R_S I_S$$

where $R_S$ is the resistance of the resistive sensing element 25.

If $R_{ONP}$ and $R_{ONS}$ are the on-state resistances of the power transistor 10 and of the sensing transistor 11 (in the ohmic region), respectively, by applying Kirchhoff's voltage law to the mesh that includes the power transistor 10, the sensing transistor 11, and the resistive sensing element 25, we obtain $$I_P = \frac{R_S + R_{ONS}}{R_S R_{ONP}} V_{REF} \qquad (1)$$

If we define the geometrical ratio $K_A$ between the sensing transistor 11 and the power transistor 10 as $$K_A = R_{ONS}/R_{ONP} \qquad (2)$$

from Eq. (1) we obtain $$I_P = K_A \frac{V_{REF}}{R_S}\left(1 + \frac{R_S}{K_A R_{ONP}}\right) \qquad (3)$$

If we designate by $K_{TRIP}$ the ratio between the power current $I_P$ (at the protection value $I_{TRIP}$ and the sensing current $I_S$, from Eqs. (1) and (3) we obtain $$K_{TRIP} = \frac{I_P}{I_S} = K_A + \frac{R_S}{R_{ONP}} = \frac{R_{ONS} + R_S}{R_{ONP}} \qquad (4)$$

thus we obtain the protection value $I_{TRIP}$ of the power current $I_P$ $$I_{TRIP} = K_{TRIP}\frac{V_{REF}}{R_S} \qquad (5)$$

If the current requirement of the protected electronic device 2 increases further, the power transistor 10 enters the saturation region, and the output voltage $V_{OUT}$ decreases, preventing further increase of the output current $I_O$ delivered.

In the saturation region, operation of the power transistor 10 and of the sensing transistor 11 is described by the following laws:

$$I_P = \frac{\mu_N C_{OX}}{2}\frac{W_P}{L_P}(V_{GSP} - V_{TP})^2(1 + \lambda V_{DSP}) = \tag{6}$$
$$= \frac{\mu_N C_{OX}}{2}\frac{W_P}{L_P}(V_{GSS} + V_{REF} - V_{TP})^2(1 + \lambda V_{DSS} + V_{REF})$$

$$I_S = \frac{\mu_N C_{OX}}{2}\frac{W_P}{L_P}(V_{GSS} - V_{TS})^2(1 + \lambda V_{DSS}) \tag{7}$$

where:

$V_{GSP}$, $V_{DSP}$, $V_{TP}$, $W_P$, and $L_P$ are the gate-to-source voltage, the drain-to-source voltage, the threshold voltage, the channel width, and the channel length, respectively, of the power transistor 10;

$V_{GSS}$, $V_{DSS}$, $V_{TS}$, $W_S$, and $L_S$ are the gate-to-source voltage, the drain-to-source voltage, the threshold voltage, the channel width, and the channel length, respectively, of the sensing transistor 11;

$\mu_N$ is the mobility of the majority charge carriers, here electrons;

$C_{OX}$ is the gate-oxide capacity per unit area; and $\lambda$ is the coefficient that takes into account the effect of channel modulation as a function of the drain-to-source voltage.

Eqs. (6) and (7) are obtained considering that the difference between the gate-to-source voltages of the power transistor 10 and of the sensing transistor 11 is equal to the voltage on the resistive sensing element 25 and, when the transistors 10, 11 operate in the saturation region, said voltage is equal to the reference voltage $V_{REF}$. In other words, we have $$V_{GSD} = V_{GSS} + V_{REF}$$

The saturation ratio $K_{SAT}$ between the power current $I_D$ and the sensing current $I_S$ with the transistors 10, 11 in saturation (a condition that arises when the protection device 3 trips to limit the output current $I_O$ to the protected electronic device 2) is given by $$K_{SAT} = \frac{I_P}{I_S} = K_A \frac{(V_{GSS} + V_{REF} - V_{TP})^2}{(V_{GSS} - V_{TS})^2}\frac{1 + \lambda V_{DSS} + V_{REF}}{1 + \lambda V_{DSS}} \tag{8}$$

If we neglect the effect of channel modulation and define the overdrive voltage $V_{OD}$ as $$V_{OD} = V_{GSS} - V_{TS} \tag{9}$$

Eq. (8) may be rewritten as follows:

$$K_{SAT} = K_A \frac{(V_{OD} + V_{REF} + V_{TS} - V_{TP})}{V_{OD}^2} \tag{10}$$

If also the difference between the threshold voltages is neglected, we obtain $$K_{SAT} = K_A\left(1 + \frac{V_{REF}}{V_{OD}}\right)^2 \tag{11}$$

which, once approximated by its development in McLaurin series, yields $$K_{SAT} = K_A\left(1 + 2\frac{V_{REF}}{V_{OD}}\right) \tag{12}$$

The maximum current that may be supplied by the power transistor 10 in saturation conditions, hereinafter referred to as saturation current $I_{PSAT}$, is given by the following relation:

$$I_{PSAT} = K_{SAT} I_S = K_{SAT}\frac{V_{REF}}{R_S} \tag{13}$$

From Eqs. (5) and (13) it is evident that the saturation current $I_{PSAT}$ has the protection value $I_{TRIP}$ if the condition $$K_{SAT} = K_{TRIP} \tag{14}$$

is satisfied.

On the basis of Eqs. (4) and (12), the condition (14) is satisfied when $$V_{TS} = V_{GSS} - 2\frac{R_{ONS}}{R_S}V_{REF} \tag{15}$$

The threshold voltage $V_{TS}$ of the sensing transistor 11 is in turn determined by the voltage between the source region 20 and the body region 22, which is set by the body-driving stage 15 through the body terminal 11*d*.

The body-driving stage 15 in practice enables modification of the threshold voltage $V_{TS}$ of the sensing transistor 11 as a function of the operating conditions of the power transistor 10, in particular when the power transistor 10 enters the saturation region. Entry of the power transistor 10 into the saturation region, in fact, causes an increase of its drain-to-source voltage and a corresponding lowering of the output voltage $V_{OUT}$, which is detected by the sensing network 30 and sent back to the body terminal 11*d* of the saturation transistor 11 by the body-driving stage 15. In this way, the drop in the power current $I_P$ of the power transistor 10 normally induced by passage to the saturation region is effectively compensated and cancelled out by the action of the body-driving stage 15. Also in the limitation condition, the power transistor 10 is thus still able to deliver a current equal to the protection value $I_{TRIP}$. The body-driving stage 15 guarantees with sufficient approximation that the condition (15) is satisfied. It is not, however, indispensable for the body-driving stage structure 15 to be as the one illustrated by way of non-limiting example in FIG. 2.

The condition of current limitation of the protection device 3 is further reversible without any need for reset actions. Consequently, the protection device 3 may fall within the normal operating conditions once the condition of overcurrent required by the load, i.e., by the protected electronic device 2, ceases.

Finally, it is evident that modifications and variations may be made to the devices and the methods described herein, without departing from the scope of the present disclosure.

In the first place, it is clear that the sensing circuit could be made in a complementary way, with conductivity of the components, voltages, and currents opposite to what has been described.

Further, it is possible to obtain the sensing network that supplies a quantity indicating the gate-to-source voltage of the power transistor in a different way. For example, the constant-current generator could be adjustable for calibrating the action of the body-driving stage. The sensing network could also include a voltage divider.

The body-driving amplifier may have non-unit gain and does not necessarily have to be in follower configuration purely with buffer function.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electrical protection device, comprising:
an input line;
an output terminal;
a power transistor coupled between the input line and the output terminal;
a sensing transistor coupled between the input line and the output terminal and having a body terminal;
a control stage coupled to respective control terminals of the power transistor and of the sensing transistor and configured to limit a first current of the power transistor to a protection value; and
a body-driving stage coupled to the body terminal and configured to bias the body terminal of the sensing transistor as a function of an operating condition of the power transistor to compensate for a drop in the first current of the power transistor induced by a passage of the power transistor from a condition of operation in an ohmic region to a condition of operation in a saturation region.

2. The electrical protection device according to claim 1, wherein the body-driving stage is configured to bias the body terminal of the sensing transistor as a function of a voltage between conduction terminals of the power transistor.

3. The electrical protection device according to claim 1, wherein the body-driving stage is configured to bias the body terminal of the sensing transistor to increase an absolute value of a threshold voltage of the sensing transistor in response to the power transistor passing from a condition of operation in the ohmic region to a condition of operation in saturation.

4. The electrical protection device according to claim 1, wherein the body-driving stage comprises a sensing network, that supplies a voltage indicating an output voltage on the output terminal, and a body-driving amplifier having an input coupled to the sensing network and an output coupled to the body terminal of the sensing transistor.

5. The electrical protection device according to claim 4, wherein the body-driving amplifier has in a follower configuration.

6. The electrical protection device according to claim 5, wherein:
the power transistor has conduction terminals connected to the input line and to the output terminal, respectively;
the sensing network includes a resistor and a current generator connected in series between the output terminal and a constant-potential line; and
an input of the body-driving amplifier is connected to an intermediate node between the sensing resistor and the current generator.

7. The electrical protection device according to claim 1, wherein the control stage comprises a control amplifier configured to drive the gate terminals of the power transistor and sensing transistor as a function of a second current through the sensing transistor.

8. The electrical protection device according to claim 7, wherein the control stage comprises a reference resistive sensing element coupled between the sensing transistor and the output terminal, and a reference generator that supplies a reference voltage and has a first terminal in common with a first terminal of the reference resistive sensing element; and wherein the control amplifier has a first input terminal connected to a second terminal of the reference resistive sensing element and a second input terminal connected to a second terminal of the reference generator.

9. The protection device according to claim 1, wherein the power transistor and the sensing transistor are MOS transistors, and wherein the sensing transistor has an aspect ratio smaller than an aspect ratio of the power transistor.

10. An electronic apparatus, comprising:
an electronic device; and
a protection device including an output node coupled to the electronic protection device, the protection device further including,
an input node configured to receive an input voltage;
a power transistor having conduction nodes coupled between the input node and the output node, and the power transistor including a control node;
a sensing transistor having conduction nodes coupled between the input node and the output node, and the sensing transistor including a control node and a body node;
a control stage circuit coupled to the control nodes of the power transistor and the sensing transistor, the control stage configured to generate a control signal based on a sensing current through the sensing transistor, the control signal being applied to the control nodes of the sensing and power transistors and the control stage configured to adjust a value of the control signal to limit a first current through the power transistor; and
a body-driving stage circuit coupled to the body node of the sensing transistor, the body-driving stage circuit configured to sense operation of the power transistor in a saturation region and configured, in response to detecting operation of the power transistor in the saturation region, to generate a biasing signal on the body node having a value to maintain the first current through the power transistor at a maximum saturation current.

11. The electronic apparatus of claim 10, wherein the body-driving stage circuit is configured to generate the biasing signal having a value that is a function of a voltage between the conduction nodes of the power transistor.

12. The electronic apparatus of claim 10, wherein the body-driving stage circuit is configured to generate the biasing signal to control a threshold voltage of the sensing transistor in response to the power transistor passing from a condition of operation in an ohmic region to a condition of operation in a saturation region.

13. The electronic apparatus of claim 10 further comprising a voltage source coupled to the input node to supply an input voltage on the input node and an output current to the electronic device.

14. The electronic apparatus of claim 13, wherein the voltage source is one of a battery that is internal to the electronic apparatus or a mains power line that is external to the electronic apparatus.

15. A method of protecting an electronic device, comprising:
  connecting a power transistor and a sensing transistor between an input line and an output terminal;
  sensing a sensing current through the sensing transistor;
  driving respective control terminals of the power transistor and of the sensing transistor based on the sensing current to limit a first current of the power transistor to a protection value;
  biasing a body terminal of the sensing transistor to compensate for a reduction in the first current of the power transistor that would otherwise occur in response to the power transistor changing from operation in an ohmic region of the power transistor to operation in a saturation region of the power transistor.

16. The method according to claim 15, wherein biasing the body terminal of the sensing transistor comprises applying a body voltage to the body terminal as a function of a voltage between conduction terminals of the power transistor.

17. The method according to claim 15, wherein biasing the body terminal of the sensing transistor comprises detecting a voltage indicating an output voltage on the output terminal and determining the body voltage as a function of the output voltage.

18. The method according to claim 15, wherein the body terminal of the sensing transistor is biased so that a threshold voltage of the sensing transistor increases in absolute value in response to passage of the power transistor from a condition of operation in the ohmic region to a condition of operation in saturation.

19. The method according to claim 15, wherein the body-driving stage comprises a sensing network, which supplies a voltage indicating an output voltage on the output terminal, and a body-driving amplifier, having an input coupled to the sensing network and an output coupled to the body terminal of the sensing transistor.

* * * * *